(12) United States Patent
Lin et al.

(10) Patent No.: US 12,154,808 B2
(45) Date of Patent: Nov. 26, 2024

(54) SYSTEM AND METHOD FOR WAFER MANUFACTURING PROCESS MANAGEMENT

(71) Applicant: Taiwan Semiconductor Manufacturing Co., Ltd., Hsinchu (TW)

(72) Inventors: Mei-Hsuan Lin, Hsinchu (TW); Rong Syuan Fan, Hsinchu (TW); Jen-Yuan Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 224 days.

(21) Appl. No.: 17/832,377

(22) Filed: Jun. 3, 2022

(65) Prior Publication Data
US 2023/0395414 A1    Dec. 7, 2023

(51) Int. Cl.
| | |
|---|---|
| *H01L 21/677* | (2006.01) |
| *B60L 1/00* | (2006.01) |
| *B60L 50/60* | (2019.01) |
| *G05B 19/418* | (2006.01) |
| *H01L 21/673* | (2006.01) |

(52) U.S. Cl.
CPC .......... *H01L 21/67724* (2013.01); *B60L 1/00* (2013.01); *B60L 50/60* (2019.02); *G05B 19/41895* (2013.01); *H01L 21/67393* (2013.01); *H01L 21/67727* (2013.01); *B65G 2201/0297* (2013.01); *G05B 2219/31002* (2013.01)

(58) Field of Classification Search
CPC ...... B65G 2201/0297; H01L 21/67724; H01L 21/67703; H01L 21/6773; H01L 21/67727; H01L 21/67389; H01L 21/67393; G05B 19/4189; G05B 19/41895; G05B 2219/31002
See application file for complete search history.

(56) References Cited

U.S. PATENT DOCUMENTS

| | | | | |
|---|---|---|---|---|
| 2012/0321423 A1* | 12/2012 | MacKnight | ....... | H01L 21/67276 414/664 |
| 2019/0148198 A1* | 5/2019 | Hsieh | ..................... | B25J 9/1694 700/218 |

FOREIGN PATENT DOCUMENTS

| | | | | |
|---|---|---|---|---|
| EP | 509256 A1 * | 10/1992 | ....... | H01L 21/67389 |
| JP | 2004207279 A * | 7/2004 | | |

OTHER PUBLICATIONS

Liao, Da-Yin, "A Distributed-Ledger, Edge-Computing Architecture for Automation and Computer Integration in Semiconductor Manufacturing," Jan. 15, 2020, Global Journal of Computer Science and Technology (Year: 2020).*

* cited by examiner

*Primary Examiner* — Spencer D Patton
(74) *Attorney, Agent, or Firm* — Seed IP Law Group LLP

(57) ABSTRACT

A semiconductor processing system includes a first semiconductor processing site and a second semiconductor processing site. The system includes an unmanned electric vehicle configured to carry a portable cleanroom stocker between the first and second semiconductor processing sites. The portable cleanroom stocker is configured to maintain cleanroom conditions within the portable cleanroom stocker during transportation.

20 Claims, 10 Drawing Sheets

SYSTEM AND METHOD FOR WAFER MANUFACTURING PROCESS MANAGEMENT

BACKGROUND

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, plugs, and other integrated circuit structures and components.

Processing steps may be performed using various tools at a semiconductor fabrication facility. Such tools can include thin-film deposition tools, etching tools, ion implantation tools, annealing tools, planarization tools, cleaning tools, dicing tools, and various other tools. After a process has been performed on a wafer with a particular tool, the wafer may be stored at a storage location or transferred to the location of another tool for a next processing step. The tools and storage facilities may be at various locations within a same fabrication facility, within a same building at the fabrication facility, within different buildings at the fabrication facility, or at a separate fabrication facility.

Transporting the wafers introduces the risk of contamination of the wafers. If wafers are contaminated, then the integrated circuits that will be diced from the wafer may function poorly or may not function at all. Wafer yields may be reduced and electronic devices that will utilize the integrated circuits may not work properly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
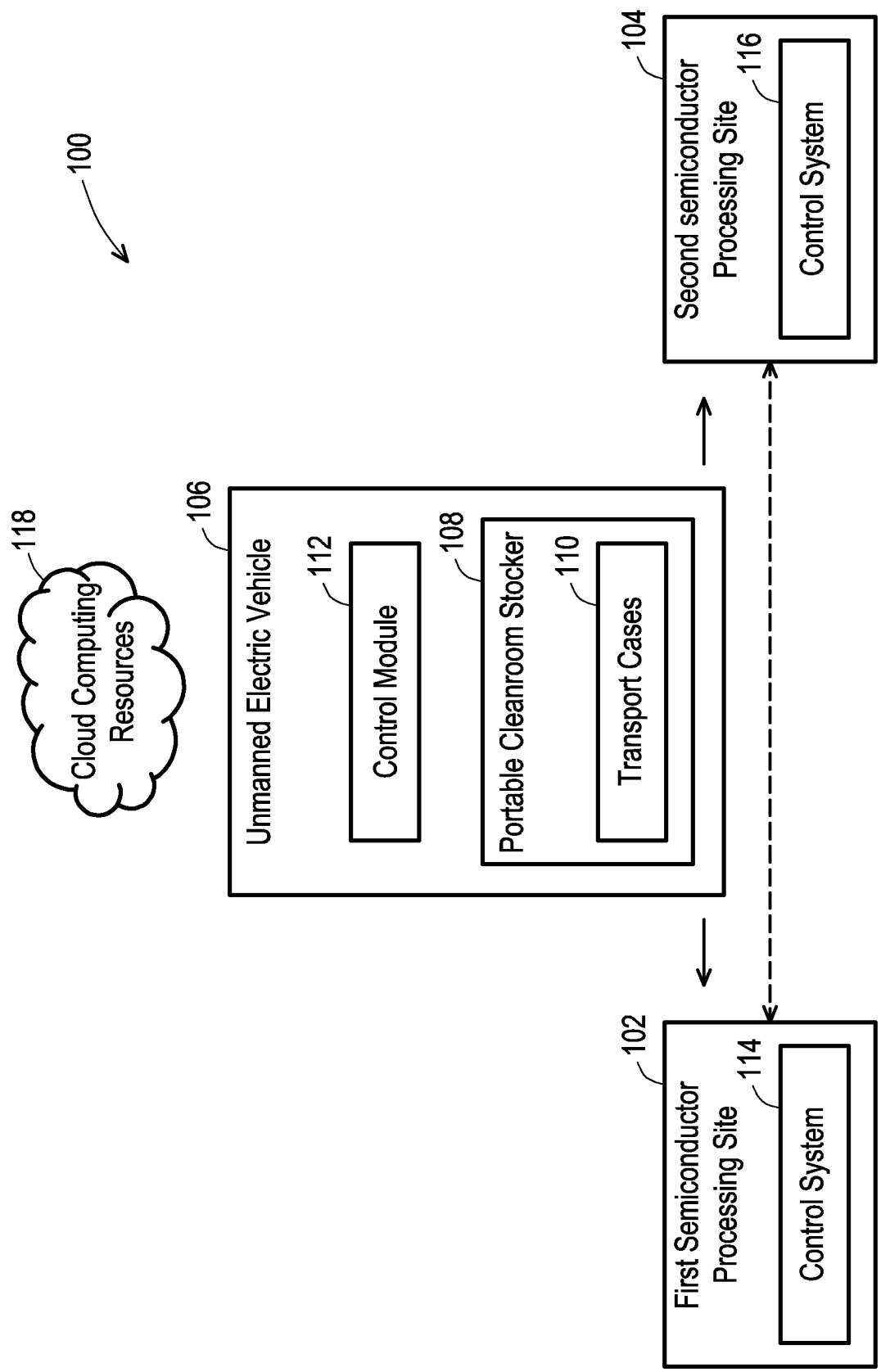
FIG. 1 is a block diagram of a semiconductor processing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure help ensure that semiconductor wafers or other sensitive semiconductor processing equipment or materials are not contaminated during transport between semiconductor processing sites. Embodiments of the present disclosure provide an unmanned electric vehicle that can carry a portable cleanroom stocker. The portable cleanroom stocker includes a plurality of storage ports for securely holding transport cases utilized to store or transport sensitive semiconductor equipment such as wafers or reticles. The portable cleanroom stocker provides full cleanroom level environments within the interior of the portable cleanroom stocker during transport of the transport cases. The portable cleanroom stocker can also include unmanned travel to load and unload itself from the unmanned electric vehicle.

The combination of the unmanned electric vehicle and the portable cleanroom stocker provide several benefits. Transport of sensitive wafers or other equipment between semiconductor processing sites can be accomplished in an entirely automated manner while providing full cleanroom level environmental protection of the sensitive equipment within the portable cleanroom stocker. This ensures that semiconductor wafers and other sensitive equipment are not contaminated during transport between semiconductor processing sites. The result is better functioning integrated circuits and improved wafer yields.

FIG. 1 is a block diagram of a semiconductor processing system 100, in accordance with some embodiments. The semiconductor processing system includes a first semiconductor processing site 102, a second semiconductor processing site 104, an unmanned electric vehicle 106, and a portable cleanroom stocker 108. As will be set forth in more detail below, components of the semiconductor processing system 100 cooperate to ensure that cleanroom level environments are maintained for sensitive semiconductor equipment during transportation of the sensitive semiconductor equipment between the first semiconductor processing site 102 and the second semiconductor processing site 104. In particular, embodiments of the present disclosure provide the unmanned electric vehicle 106 and the portable cleanroom stocker 108 to maintain cleanroom conditions for sensitive semiconductor equipment during transport between the first processing site 102 and the second processing site 104.

The semiconductor processing system 100 processes semiconductor wafers. The semiconductor wafers undergo a large number of semiconductor processes in order to form integrated circuits within the semiconductor wafers. The semiconductor processes can include forming transistors on a semiconductor substrate within the semiconductor wafers, forming dielectric layers on the semiconductor wafers, forming metal interconnects on the semiconductor wafers, and other processes to form structures and components within the semiconductor wafers. Some of the processes associated with forming the features can include epitaxial growth processes, thin film deposition processes, photolithography processes, chemical mechanical planarization (CMP) processes, annealing processes, ion implantation processes, cleaning processes, dicing processes, and various other processes.

The semiconductor wafers may be highly sensitive to contamination during processing. Even very small amounts of contamination by very small debris particles can cause large negative effects on the formation of integrated circuit features and on the function of the integrated circuits that will be diced from the semiconductor wafers. Accordingly, the semiconductor processing system 100 maintains cleanroom conditions for the semiconductor wafers during processing, during storage, and during transportation. The cleanroom conditions help ensure that the semiconductor wafers are not contaminated. Further details regarding specifications of cleanroom conditions will be set forth below.

Semiconductor wafers are not the only semiconductor equipment sensitive to contamination during processing, storage, or transport. For example, photolithography processes utilize photolithography reticles to produce patterns and layers of photoresist on the semiconductor wafers. In the example of extreme ultraviolet (EUV) photolithography, an EUV reticle includes a reflective multilayer at an exposure surface of the EUV reticle. The reflective multilayer carries a pattern intended to be imprinted onto a layer of photoresist via EUV light that reflects off of the exposure side of the reticle. Accordingly, EUV photolithography systems generate EUV light and direct the EUV light onto the exposure surface of the EUV reticle. The light reflects off of the EUV reticle and carries the pattern of the reflective multilayer. Projection optics may then direct the EUV light onto the surface of a semiconductor wafer to pattern a layer of photoresist.

If there are debris particles on the exposure side of the EUV reticle, then those debris particles will affect the pattern carried by the EUV light onto the photoresist. The presence of debris particles on the exposure surface of the EUV reticle can result in faulty patterns imprinted on the photoresist layer. These faulty patterns then affect features formed in the semiconductor wafers. This can render integrated circuits nonfunctioning. Furthermore, it can be extremely costly in terms of time and money to clean the EUV reticles that have been contaminated. The semiconductor processing system 100 can provide cleanroom conditions for EUV reticles during processing, storage, and transport. While a specific example has been provided in relation to EUV reticles, reticles for other types of photolithography processes can also be utilized without departing from the scope of the present disclosure.

To protect semiconductor wafers, photolithography reticles, and other sensitive semiconductor equipment during storage and transport, the photolithography system 100 utilizes equipment transport cases 110. The equipment transport cases 110 can hold semiconductor wafers, photolithography reticles, wafer frames, or other sensitive semiconductor processing materials such as chemicals utilized in various semiconductor processes.

In some embodiments, the transport cases 110 can include a front opening unified pod (FOUP). The FOUP includes a casing that defines an interior volume. The interior volume includes a plurality of slots. Each slot is configured to hold a wafer. The FOUP includes a front cover that can be selectively opened or removed in order to allow loading or unloading of semiconductor wafers from the FOUP. The FOUP can provide protection from contamination during storage and transport. However, as will be set forth in more detail below, the FOUP by itself may not be sufficient to prevent contamination of the semiconductor wafers.

In some embodiments, the transport cases 110 can hold pods for photolithography reticles. The pods can enclose the photolithography reticles and help protect the photolithography reticles from contamination. In some embodiments, the transport cases 110 can include wafer cassettes. The wafer cassettes can hold a plurality of semiconductor wafers similar to the FOUP, but in some cases, without a front cover. In some embodiments, the transport cases 110 can include wafer frame cassettes. The wafer frame cassettes can include a plurality of slots that each hold a wafer frame. Each wafer frame can carry a semiconductor wafer on an adhesive film for dicing or for other purposes. The transport cases 110 can include crystal boxes, magazines, tray cassettes, chemical storage bins, or other types of cases for storing one or more articles of semiconductor processing equipment or semiconductor processing materials.

The first semiconductor processing site 102 can include a semiconductor processing tool. The semiconductor processing tool may be a tool that can perform one or more semiconductor processes on semiconductor wafers. The semiconductor processing tool can include a thin-film deposition tool, an etching tool, a photolithography tool, an ion implantation tool, a CMP tool, a wafer cleaning tool, a reticle cleaning tool, or other types of tools.

The first semiconductor processing site 102 maintains cleanroom conditions at the semiconductor processing tool and in all locations at which sensitive semiconductor equipment may be present. Cleanroom environments are classified in terms of numbers and sizes of particles suspended in its atmosphere. In one example, the international organization for standardization (ISO) has developed a set of cleanroom environment standards known as ISO 14644-1. The standard utilizes the following formula to define the maximum concentrations of particles per class and per particle size:

$$C_N = 10^N (0.1/D)^{2.08},$$

where $C_N$ is the maximum concentration of particles in a volume of 1 m³ of airborne particles that are equal to or larger than the considered particle size which is rounded to the nearest whole number, N is the ISO class number, D is the size of the particle in micrometres, and 0.1 is a constant expressed in micrometres. As an example, ISO 1 allows up to 10 particles greater than 0.1 micrometres per cubic meter of atmosphere. ISO 2 allows 100 particles greater than 0.1 micrometres per cubic meter of atmosphere. ISO 3 permits up to 1000 particles greater than 0.1 micrometres per cubic meter of atmosphere. ISO 4 permits up to 10,000 particles greater than 0.1 micrometres per cubic meter of atmosphere. ISO 5 permits up to 100,000 particles greater than 0.1 micrometres per cubic meter of atmosphere. While the present disclosure may discuss cleanroom environments in terms of ISO 14644-1 standards, other cleanroom standards can be utilized or enforced by the semiconductor processing system 100 without departing from the scope of the present disclosure.

Returning to the first semiconductor processing site 102, in some embodiments, the semiconductor processing site 102 may provide a cleanroom environment in compliance with ISO 4 or higher (ISO 1-3). The semiconductor processing site 102 may provide a cleanroom environment of other standards without departing from the scope of the present disclosure.

The first semiconductor processing site 102 can include one or more stockers for storing transport cases 110 or for otherwise storing sensitive semiconductor equipment such as wafers, reticles, and other types of sensitive articles or materials. For example, the first semiconductor processing site 102 may include one or more stockers that stock semiconductor wafers, cassettes of semiconductor wafers, or FOUPs including semiconductor wafers. Wafers may be removed from the stockers in order to process the wafers with a semiconductor processing tool at the first semiconductor processing site 102. After processing with the semiconductor processing tool, the wafers may be returned to the transport cases 110 in the stocker. Loading and unloading of wafers between the stocker and the semiconductor processing tool can be accomplished with automated robot arms or other types of automated equipment that handle the semiconductor wafers.

The first semiconductor processing site 102 may also include overhead tracks that carry transport cases between the tool, the stockers, and a portable cleanroom stocker 108, as will be described in more detail below. The first semiconductor processing site 102 can include other types of transport mechanisms for carrying transport cases 110 throughout the local area of the first semiconductor processing site 102. The first semiconductor processing site 102 may maintain cleanroom conditions in all locations through which wafers, transport cases 110, or other sensitive semiconductor equipment may pass.

The semiconductor processing site 102 includes a control system 114. The control system 114 controls the semiconductor processing tool, the stockers, the local transporters such as overhead tracks and robot arms, and other aspects of loading, unloading, transporting, and storing of wafers, transport cases, and other sensitive equipment. The control system 114 can include processing resources, memory resources, and communication resources for executing the functions of the first semiconductor processing site 102. The control system 114 may be a dispersed system with physical and virtual components in various locations. The control system 114 may utilize cloud-based computing resources.

In some embodiments, the control system 114 may include a manufacturing execution system (MES). The MES can include processing, memory, and communication resources for directing operation of the first semiconductor processing site 102. The MES can control, track, and document reception of wafers that the first semiconductor processing site 102, storage of wafers of the first semiconductor processing site 102, processing of wafers with a tool of the first semiconductor processing site 102, and transport, loading, and unloading of wafers at the first semiconductor processing site 102. This can include control, tracking, and management of transport cases 110 of the first semiconductor processing site 102. The MES can utilize local and virtual processing, memory, and communication resources to execute a series of applications for the operation and management of the first semiconductor processing site 102. Each application may correspond to a particular operation such as loading, unloading, processing, storing, or transporting of wafers or transport cases 110 that the first semiconductor processing site 102.

In some embodiments, the control system 114 includes one or more cloud-based virtual machine servers. The virtual machine servers can execute applications responsive to commands from the local control system 114.

The semiconductor processing system 100 may include cloud computing resources 118. The cloud computing resources 118 are cloud-based memory, processing, and communication resources. A portion of the cloud computing resources 118 may be part of the control system 114.

The second semiconductor processing site 104 is a processing site separate from the first semiconductor processing site 102. The second semiconductor processing site 104 may be at a separate semiconductor fabrication facility from the first semiconductor processing site 102 or maybe at the same semiconductor processing facility as the first semiconductor processing site 102. As the semiconductor processing facility may be very large, there may yet be a large distance between the first and second semiconductor processing sites 102 and 104 even when they are at the same semiconductor processing facility.

The second semiconductor processing site 104 may include the same types of facilities as described in relation to the first semiconductor processing site 102. In particular, the second semiconductor processing site 104 may include one or more semiconductor processing tools, one or more stockers for storing transport cases 110 including sensitive semiconductor equipment, automated loading, unloading, and transfer mechanisms, transfer tracks or pathways, and other types of components, systems, or facilities. The second semiconductor processing site 104 maintains a cleanroom environment in the vicinity of all sensitive semiconductor equipment in accordance with a selected cleanroom environment standard, as described previously.

The second semiconductor processing site includes a control system 116. The control system 116 can include the same types of computing resources and systems as described in relation to the control system 114. Accordingly, the control system 116 may include local and virtual processing, memory, and communication resources. The control system 116 controls, tracks, and records all aspects of operations at the second semiconductor processing site 104. The control system 116 can include an MES. The MES can include virtual machine servers in the cloud computing resources 118 for executing applications.

In some cases sensitive semiconductor equipment may need to be transferred from the first semiconductor processing site 102 to the second semiconductor processing site 104. For example, the particular semiconductor processing step may be performed on wafers at the first semiconductor processing site 102 and the tool for performing a next semiconductor processing step may be located at the second semiconductor processing site 104. In this case, wafers may need to be loaded into transport cases 110 and transported from the first semiconductor processing site 102 to the second semiconductor processing site 104. In another example, the second semiconductor processing site 104 may include stockers or other storage facilities for storing wafers or transport cases 110 after processing at the first semiconductor processing site 102.

Sensitive semiconductor equipment may be particularly vulnerable to contamination while being transported between semiconductor processing sites. In some systems, wafers, transport cases, or other sensitive semiconductor equipment may be loaded by hand onto a manned vehicle for transportation between semiconductor processing sites. In such a scenario, the sensitive equipment is vulnerable to contamination at loading onto the manned vehicle, during transport by the manned vehicle, and during unloading from the manned vehicle.

Embodiments of the present disclosure provide the unmanned electric vehicle 106 and the portable cleanroom stocker 108 to assist in maintaining cleanroom conditions while transporting the transport cases 110 including sensitive semiconductor equipment between the first semiconductor processing site 102 and the second semiconductor processing site 104.

The unmanned electric vehicle 106 is utilized to transport the portable cleanroom stocker 108 between the first and second semiconductor processing sites 102 and 104. Details regarding the portable cleanroom stocker 108 will be provided below. In one example, the unmanned electric vehicle picks up the portable cleanroom stocker 108 at the first semiconductor processing site 102. The portable cleanroom stocker 108, carrying the transport cases 110, is loaded into the unmanned electrical vehicle 106 at the first semiconductor processing site 102. The unmanned electric vehicle 106 transports the portable cleanroom stocker 108 to the second semiconductor processing site 104. The portable cleanroom stocker 108 is unloaded from the unmanned electric vehicle 106 of the second semiconductor processing site 104.

Because the unmanned electric vehicle 106 is not driven locally by a human, a significant potential source of contamination is avoided. Instead, the unmanned electric vehicle 106 receives instructions to carry the portable cleanroom stocker 108 on a route between the first semiconductor processing site 102 and the second semiconductor processing site 104. The unmanned electric vehicle 106 then carries out the instructions automatically without further human intervention.

Another benefit to the unmanned electric vehicle 106 is that the unmanned electric vehicle 106 does not generate emissions. Accordingly the unmanned electric vehicle 106 does not generate gases and particulates that combustion engine vehicles generate and that could be a major source of contamination for the transport cases 110 and their sensitive semiconductor equipment.

In some embodiments, the unmanned electric vehicle 106 includes a control module 112. The control module 112 includes processing resources, software resources, and communication resources for carrying out instructions to transport the portable cleanroom stocker 108 between designated destinations. Some of the processing, software, and communication resources may be part of cloud-based computing resources 118.

In some embodiments, the control module 112 includes an MES or an MES interface. The MES or MES interface receives a command from the MES of the control system 114 to transport the portable cleanroom stocker 108 to the second semiconductor processing site 104. The command may include an identification of the second semiconductor processing site 104. In general, a command to transport may include an identification of a starting site and an identification of a destination site. The identification may include an alphanumeric code or other types of identifiers that cause the control module 112 to transport the portable cleanroom stocker 108 from the first semiconductor processing site 102 to the second semiconductor processing site 104.

In some embodiments, the unmanned electric vehicle 106 includes a transportation data management module. The transportation data management module records transportation data related to the transportation of the portable cleanroom stocker 108. The transportation data can include the identification of the first semiconductor processing site 102, the identification of the second semiconductor processing site 104, details of the route taken between the first and second semiconductor processing sites 102 and 104, details regarding the starting time, the completion time, and the duration of the trip, details regarding an identification of the portable cleanroom stocker 108 and the transport cases 110 carried on the portable cleanroom stocker 108, and other details regarding the trip.

The control module 112 may also include automated navigation systems for controlling the vehicle between the first and second semiconductor processing sites 102 and 104. The unmanned electric vehicle 106 may include a suite of object detection sensors and other types of sensors assisting in navigation of the unmanned electric vehicle 106.

The portable cleanroom stocker 108 is both a stocker for storing transport cases 110 and an unmanned, self-driving vehicle. The portable cleanroom stocker 108 includes a plurality of ports or lockers. Each port or locker is configured to receive and store a transport case 110 including sensitive semiconductor equipment such as wafers or reticles.

The portable cleanroom stocker 108 is configured to maintain a cleanroom environment within the interior volume of the portable cleanroom stocker 108. In particular, the portable cleanroom stocker 108 is configured to maintain a cleanroom environment in the vicinity of the stored transport cases 110. As described previously, the first and second semiconductor processing sites 102 may be subject to a particular cleanroom environment standard. The portable cleanroom stocker 108 is configured to maintain a same or higher cleanroom environment standard as the first and second semiconductor processing sites 102 and 104, including up to an ISO 1 standard, in some embodiments.

The portable cleanroom stocker 108 includes an interior environment management system, purging fluid sources, purging fluid channels, a circulation system, and sensors for monitoring the interior environment of the portable cleanroom stocker 108. The interior environment management system controls these components to continuously or periodically cycle purging fluids around or through each of the transport cases 110 to ensure that a cleanroom environment is maintained within the portable cleanroom stocker 108.

The portable cleanroom stocker 108 may include wheels, a drivetrain, and a vehicle guidance module. Accordingly, the portable cleanroom stocker 108 can travel within the first semiconductor processing site 102. For example, the portable cleanroom stocker 108 can travel to loading and unloading locations to receive transport cases 110. The portable cleanroom stocker 108 can then automatically drive to a pickup location at which the unmanned electric vehicle 106 can pick up the portable cleanroom stocker 108.

The portable cleanroom stocker may include an MES interface. The MES interface can receive MES commands to travel to a particular location, to pick up or unload transport cases 110, to embark onto the unmanned electric vehicle 106, to maintain cleanroom environments, and to disembark from the unmanned electric vehicle 106. The MES interface may communicate with the control module 112 of the unmanned electric vehicle 106, with the control system 114 of the first semiconductor processing site 102, and with control module 116 of the second semiconductor processing site 116. The portable cleanroom stocker 108 may include processing, memory, and communication resources to execute the functions of the unmanned electric vehicle 106. The portable cleanroom stocker 108 may also include a power source for driving and for maintaining the cleanroom environment one outside of the unmanned electric vehicle 106. The portable cleanroom stocker 108 may receive power from the unmanned electric vehicle 106 when docked within the unmanned electric vehicle 106.

Figure 2:
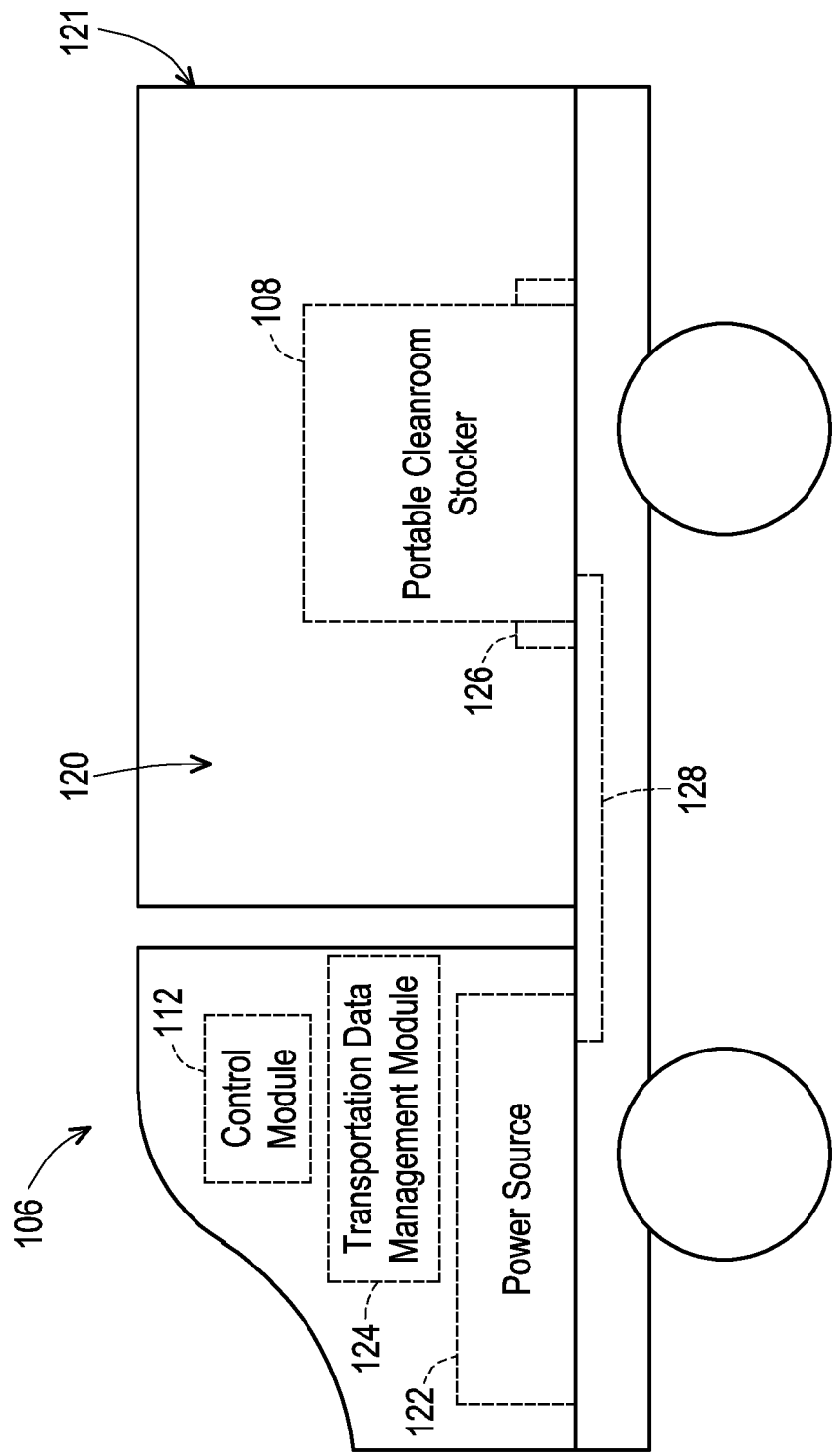
FIG. 2 is an illustration of an unmanned electric vehicle of a semiconductor processing system, in accordance with some embodiments.

FIG. 2 is an illustration of an unmanned electric vehicle 106, in accordance with some embodiments. The unmanned electric vehicle 106 includes a cargo bay 120. The unmanned electric vehicle 106 may also include a door or hatch 121 for receiving equipment into the cargo bay 120. In particular, the portable cleanroom stocker 108 can be loaded into the cargo bay 120 via the door 121.

The unmanned electric vehicle 106 may include a control module 112. The control module 112 includes processing resources, software resources, and communication resources for carrying out instructions to transport the portable cleanroom stocker 108 between designated destinations. Some of the processing, software, and communication resources may be part of cloud-based computing resources 118.

In some embodiments, the control module 112 includes an MES or an MES interface. The MES or MES interface receives a command from the MES of the control system 114 to transport the portable stocker 108 to the second semiconductor processing site 104. The command may include an identification of the second semiconductor processing site 104. In general, a command to transport may include an identification of a starting site and an identification of a destination site. The identification may include an alphanumeric code or other types of identifiers that cause the control module 112 to transport the portable cleanroom stocker 108 from the first semiconductor processing site 102 to the second semiconductor processing site 104.

In some embodiments, the unmanned electric vehicle 106 includes a transportation data management module 124. The transportation data management module 124 records transportation data related to the transportation of the portable cleanroom stocker 108. The transportation data can include the identification of the first semiconductor processing site 102, the identification of the second semiconductor processing site 104, details of the route taken between the first and second semiconductor processing sites 102 and 104, details regarding the starting time, the completion time, and the duration of the trip, details regarding an identification of the portable cleanroom stocker 108 and the transport cases 110 carried on the portable cleanroom stocker 108, and other details regarding the trip.

The control module 112 may also include automated navigation systems for controlling the vehicle between the first and second semiconductor processing sites 102 and 104. The unmanned electric vehicle 106 may include a suite of object detection sensors and other types of sensors assisting in saving navigation of the unmanned electric vehicle 106.

The unmanned electric vehicle 106 includes a power source 122. The power source 122 can power the drivetrain of the unmanned electric vehicle 106. Accordingly, the power source 122 powers motion of the unmanned electric vehicle 106. The power source 122 can also powers the control module 112 and the transportation data management module 124. The power source 122 can include a series of batteries or other types of energy storage for providing electric power to the components of the unmanned electric vehicle 106.

The unmanned electric vehicle 106 may also include a dock 126 for receiving and holding at the portable cleanroom stocker 108. The dock 126 can include fasteners, groups, rails, slots, or other types of restraints for securely holding the portable cleanroom stocker 108 in place when the portable cleanroom stocker 108 is loaded into the dock 126. The unmanned electric vehicle 106 may also include a power conduit 128 connecting the power source 122 to the dock 126. When the portable cleanroom stocker 108 is loaded into the dock 126, the power source 122 can power the portable cleanroom stocker 108. This enables the larger power source of the unmanned electric vehicle 106 to take over maintenance of the cleanroom environment within the portable cleanroom stocker 108 during transportation of the portable cleanroom stocker 108.

In some embodiments, the unmanned electric vehicle 106 may include a truck, a car, or other types of vehicles. The unmanned electric vehicle 106 may include wheels, tracks, or other components for propelling motion of the unmanned electric vehicle 106. The unmanned electric vehicle 106 can include other components, configurations, and functions than those described above without departing from the scope of the present disclosure.

Figure 3:
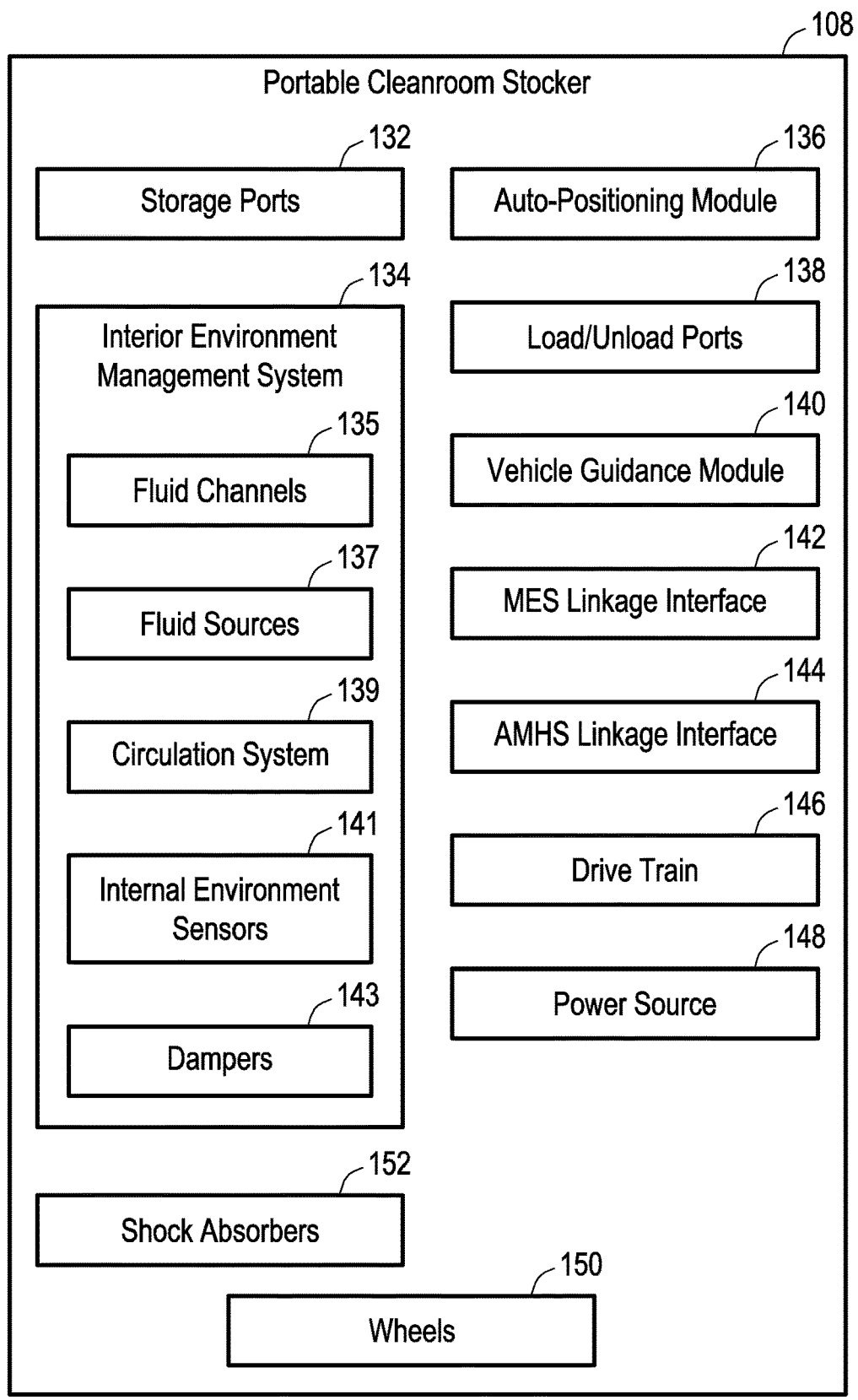
FIG. 3 is a block diagram of a portable cleanroom stocker, in accordance with some embodiments.

FIG. 3 is a block diagram of a portable cleanroom stocker 108, in accordance with some embodiments. The portable cleanroom stocker 108 includes storage ports 132. The storage ports 132 can include an array of storage ports arranged in rows and columns. Each storage port can be configured to receive a transport case 110. Each storage port can include enclosures, grooves, slots, bars, fasteners, or other types of restraints for securely receiving and holding a transport case 110. As described previously, each transport case 110 can hold one or more sensitive semiconductor equipment articles such as wafers, reticles, crystals, reticle pods, FOUPs, chemicals, or other types of sensitive semiconductor equipment.

The portable cleanroom stocker 108 includes an interior environment management system 134. The interior environment management system 134 maintains a cleanroom environment within an interior of the portable cleanroom stocker 108. In particular, the interior environment management system 134 maintains a cleanroom environment in or around the transport cases 110 held by the storage ports 132.

The interior environment management system 134 can include fluid channels 135, fluid sources 137, and a circulation system 139. The fluid sources 137 contain purging fluids for continually or periodically fleshing out or driving out impurities and particles from the interior environment of the portable cleanroom stocker 108. The fluid sources 137 can include dry air, N2, O2, or other fluids or gases suitable for maintaining a cleanroom environment within the interior of the portable cleanroom stocker 108.

The fluid channels 135 are coupled to the fluid sources 137 and can deliver the purging fluids from the fluid sources 137 into the interior environment of the portable cleanroom stocker 108. The fluid channels 135 can individually deliver fluids to each of the storage ports 132. This can ensure that each storage port 132, and the corresponding transport case 110 stored therein, receives purging fluids to maintain a cleanroom environment in the vicinity of the transport case 110.

The circulation system 139 drives circulation of the purging fluids 137. The circulation system 139 can include pumps or other drivers for driving fluid from the fluid sources 137 through the fluid channels 135. The circulation system 139 may include filters to capture particles or debris carried away with the purging fluids. The circulation system 130 my may then recycle or recirculate purging fluids through the fluid channels 135. The circulation system 139 can control the flow rate, the fleshing frequency, or other aspects related to the flow of the purging fluids.

The interior environment management system 134 may include interior environment sensors 141. The interior environment sensors 141 may sense the humidity, the pressure, the temperature, the number of contaminant particles, or other aspects related to the environment within the interior of the portable cleanroom stocker 108. The interior environment management system 134 may control the flow of fluids responsive to the interior environment sensors 141. For example, if the humidity is higher than a threshold humidity, the interior management system 134 may increase the flow of fluid through the fluid channels 135 to reduce the humidity.

The interior environment management system 134 may also include dampers 143. The dampers 143 can correspond to valves or other structures that can increase or decrease the extent to which a fluid channel 135 is open. The dampers 143 can be manipulated between positions corresponding to fully open and fully closed fluid channels 135 in order to manage the flow rate of fluids through the fluid channels 135.

The portable cleanroom stocker can include an auto positioning module 136 and load/unload ports 138. The load/unload ports 138 can receive a transport case 110 into the interior volume of the portable cleanroom stocker 108. The auto positioning module 136 can then transfer the transport case 110 from the load/unload ports 138 to a designated storage port 132. The portable cleanroom stocker 108 can also include computing resources that record and store the identity of each receive transport case 110 and the storage port 132 at which each transport case 110 is stored. When a transport case 110 is to be removed from the portable cleanroom stocker 108, the auto positioning module 136 can retrieve the transport case 110 from the corresponding storage port 132 and can deliver the transport case 110 to the load/unload port 138. The transport case 110 can then be output from the load/unload port 138.

The portable cleanroom stocker 108 can include a vehicle guidance module 140. The vehicle guidance module 140 can correspond to navigation system that navigates the portable cleanroom stocker 108 from one location to another. The vehicle guidance module 140 can also include a suite of sensors for sensing objects and other environmental aspects around the portable cleanroom stocker 108 during navigation. The vehicle guidance module 140 can navigate the portable cleanroom stocker 108 to a location to pick up one or more transport cases 110 at a first semiconductor site 102, to a pickup location and into the cargo bay 120 of the unmanned electric vehicle 106 at the pickup location, to exit the cargo bay 120 of the unmanned electric vehicle 106 at the second semiconductor processing site 104, and to a delivery location to deliver one or more transport cases 110 at the second semiconductor processing site 104.

The portable cleanroom stocker 108 can include an MES linkage interface 142. The MES linkage interface can receive MES commands to travel to a particular location, to pick up or unload transport cases 110, to embark onto the unmanned electric vehicle 106, to maintain cleanroom environments, and to disembark from the unmanned electric vehicle 106. The MES linkage interface 142 may communicate with the control module 112 of the unmanned electric vehicle 106, with the control system 114 of the first semiconductor processing site 102, and with the control module 116 of the second semiconductor processing site 116.

The portable cleanroom stocker 108 may include an automated material handling system (AMHS) linkage interface 144. The AMHS linkage interface 144 may receive commands or data related to the automated handling of transport cases 110 or other sensitive semiconductor equipment stored in the portable cleanroom stocker 108. The AMHS may communicate with the auto positioning module 136 and the load/unload ports 138 for managing reception, storage, and retrieval of transport cases 110.

The portable cleanroom stocker 108 may also include a drivetrain 146, a power source 148, and wheels 150. The drivetrain 146 can include one or more motors, traction inverters, and other components for transferring electrical energy from the power source 148 to the wheels 150 in order to automatically move the portable cleanroom stocker 108. As described previously, the power source 148 may power the portable cleanroom stocker 108 when the portable cleanroom stocker 108 is not docked in the cargo bay of the unmanned electric vehicle 106. The portable cleanroom stocker 108 can also include shock absorbers 152. This can reduce the effects of collisions, bumps, or other kinds of impacts or jarring events to the portable cleanroom stocker 108 or the unmanned electric vehicle 106. The portable cleanroom stocker 108 can include other components and configurations without departing from the scope of the present disclosure.

Figure 4:
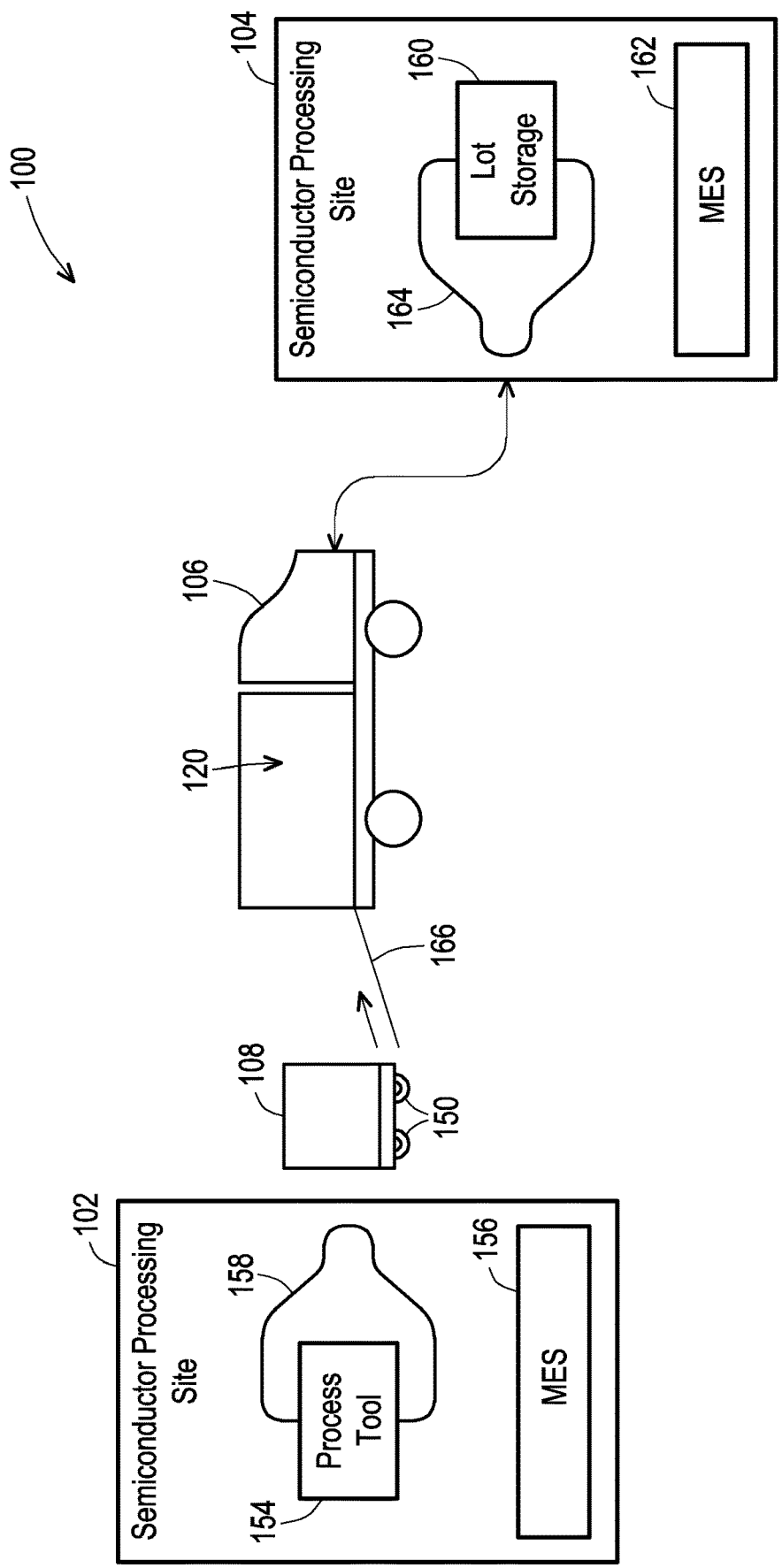
FIG. 4 is an illustration of a semiconductor processing system, in accordance with some embodiments.

FIG. 4 is an illustration of a semiconductor processing system 100, in accordance with some embodiments. The system 100 includes a first semiconductor processing site 102 and a second semiconductor processing site 104. The semiconductor processing site 102 includes a process tool 154 and a track 158. The track 158 can correspond to a route on which the portable cleanroom stocker 108 can travel within the semiconductor processing site 102. Alternatively, the track 158 can correspond to a track of an overhead transport or other type of transport unit that can carry wafers or other semiconductor process equipment. The semiconductor processing site 102 includes an MES 156. The MES 156 can correspond substantially to the MES of the control system 114 of the first semiconductor processing site 102 as described in relation to FIG. 1.

FIG. 4 illustrates a portable cleanroom stocker 108 driving up a ramp 166 into the cargo bay 121 of an unmanned electric vehicle 106 at the first semiconductor processing site 102. The portable cleanroom stocker 108 includes wheels 150, although other transport mechanisms can be utilized for the portable cleanroom stocker 108 without departing from the scope of the present disclosure. The unmanned electric vehicle 106 carries the portable cleanroom stocker 108 to the second semiconductor processing site 104 on a predesignated route. The MES 126 can send the command to the control module of the unmanned electric vehicle 106 to initiate transport to the semiconductor processing site 104, as described previously.

The semiconductor processing site 104 includes a lot storage 160 and a track 164. The lot storage 160 can include one or more stationary cleanroom stocker's back in stock transport cases 110 or other sensitive semiconductor equipment. The track 164 can correspond to a route which the portable cleanroom stocker 108 can travel within the semiconductor processing site 104. Alternatively, the track 164 can correspond to a track of an overhead transport or other type of transport unit that can carry wafers or other semiconductor process equipment. The semiconductor processing site 104 includes an MES 162. The MES 162 can correspond substantially to the MES of the control system 116 of the first semiconductor processing site 104 as described in relation to FIG. 1.

Figure 5A:
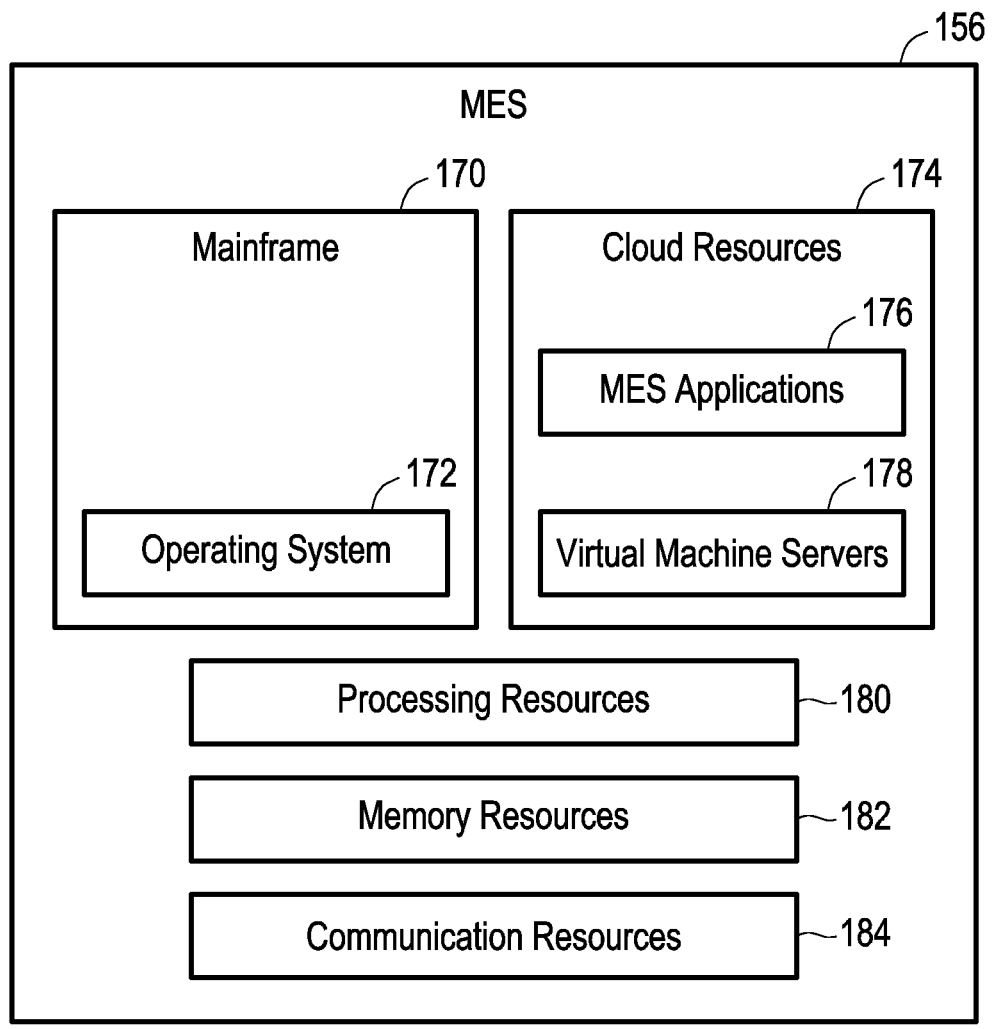
FIGS. 5A and 5B are block diagrams of control systems of semiconductor processing sites, in accordance with some embodiments.

FIG. 5A is a block diagram of the MES 156 in accordance with some embodiments. The MES 156 includes a mainframe 170 and an operating system 172. The MES 174 includes cloud resources 174. The cloud resources 174 include MES applications 176 and virtual machine servers 178. The operating system 172 of the mainframe 170 can communicate with the cloud resources 174. In particular, the virtual machine servers 178 can each execute applications associated with the MES 156. Each application can correspond to an action or command that can be taken by the MES 156 in relation to the first semiconductor processing site 102. In one example, an application can include commanding the unmanned electric vehicle 106 to carry the portable cleanroom stocker 108 to the second semiconductor processing site 104. This command can be received by the unmanned electric vehicle 106 as described previously.

The MES 156 may include additional processing resources 180 memory resources 182, and communication resources 184. The processing resources 180 can execute software instructions or application stored in the memory resources 182. The communication resources 184 can facilitate outgoing and incoming communication of the MES 156. The mainframe 170 and the cloud resources 174 can be part of the processing resources 180, the memory resources 182, and the communication resources 184.

Figure 5B:
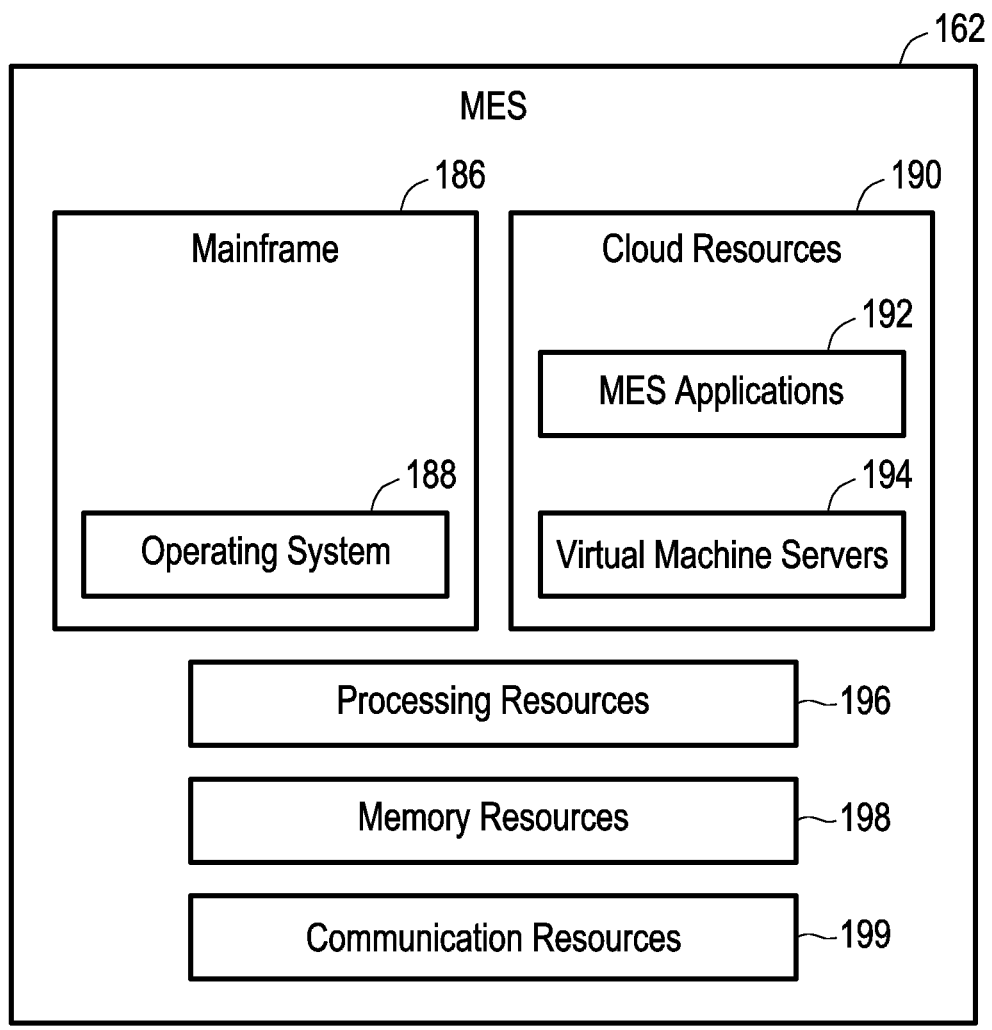

FIG. 5B is a block diagram of the MES 162 in accordance with some embodiments. The MES 162 includes a mainframe 186 and then operating system 188. The MES 162 includes cloud resources 190. The cloud resources 190 include MES applications 192 and virtual machine servers 194. The operating system 188 of the mainframe 186 can communicate with the cloud resources 190. In particular, the virtual machine servers 194 can each execute applications associated with the MES 162. Each application can correspond to an action or command that can be taken by the MES 162 in relation to the second semiconductor processing site 104.

The MES 162 may include additional processing resources 196 memory resources 198, and communication resources 199. The processing resources 196 can execute software instructions or applications stored in the memory resources 196. The communication resources 199 can facilitate outgoing and incoming communication of the MES 162. The mainframe 186 and the cloud resources 188 can be part of the processing resources 196, the memory resources 198, and the communication resources 100.

Figure 6:
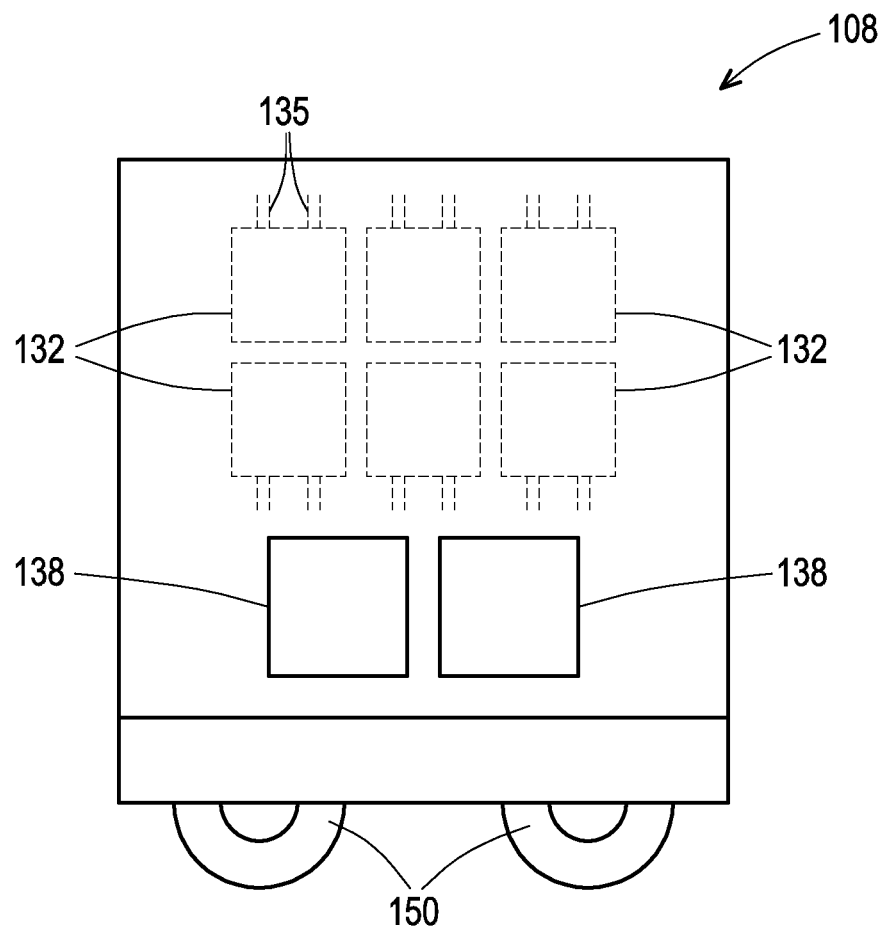
FIG. 6 is an illustration of a portable cleanroom stocker, in accordance with some embodiments.

FIG. 6 is an illustration of a portable cleanroom stocker 108, in accordance with some embodiments. The portable cleanroom stocker 108 is one example of a portable cleanroom stocker 108 of FIG. 3. The portable cleanroom stocker 108 includes load/unload port 138 by which transport cases 110 can be loaded into or retrieved from the portable cleanroom stocker 108. FIG. 6 illustrates six storage port 132 in dashed lines within an interior of the portable cleanroom stocker 108. Each storage port 132 can securely hold a transport case 108 including sensitive semiconductor equipment. Fluid channels 135 are positioned to deliver purging fluids to the storage port 132 in order to maintain the cleanroom environment in the vicinity of each storage port 132. FIG. 6 illustrates wheels 150 by which the portable cleanroom stocker 108 can be driven in an automated manner. The simplified illustration of FIG. 6 does not illustrate several of the components described in relation to FIG. 3. Nevertheless, these components may be present in the portable cleanroom stocker 108 of FIG. 6. Alternatively, other components and configurations of components can be utilized for a portable cleanroom stocker 108 without departing from the scope of the present disclosure.

Figure 7:
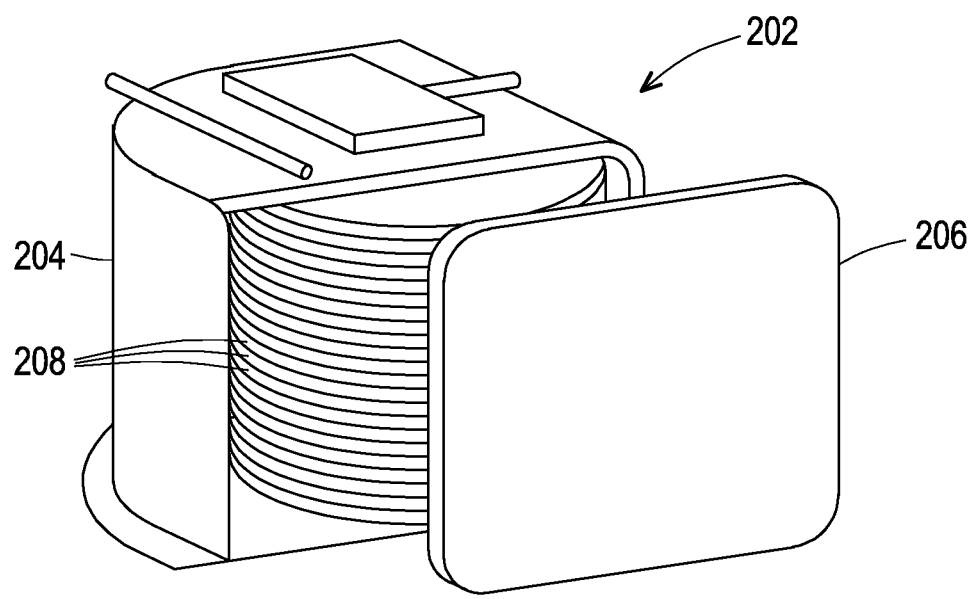
FIG. 7 is an illustration of a transport case, in accordance with some embodiments.

FIG. 7 is an illustration of a FOUP 202, in accordance with some embodiments. The FOUP 202 is one example of a transport case 110 of FIG. 1. The FOUP 202 includes the primary casing 204 having a plurality of slots. Each slot holds the semiconductor wafer 208 securely in place. The front cover or front lid 206 can be securely fixed to the primary casing 204. The primary casing 204 may include inlets by which purging fluid can be selectively flowed through the interior of the primary casing 204. Other configurations of a FOUP 202 can be utilized without departing from the scope of the present disclosure.

Figure 8:
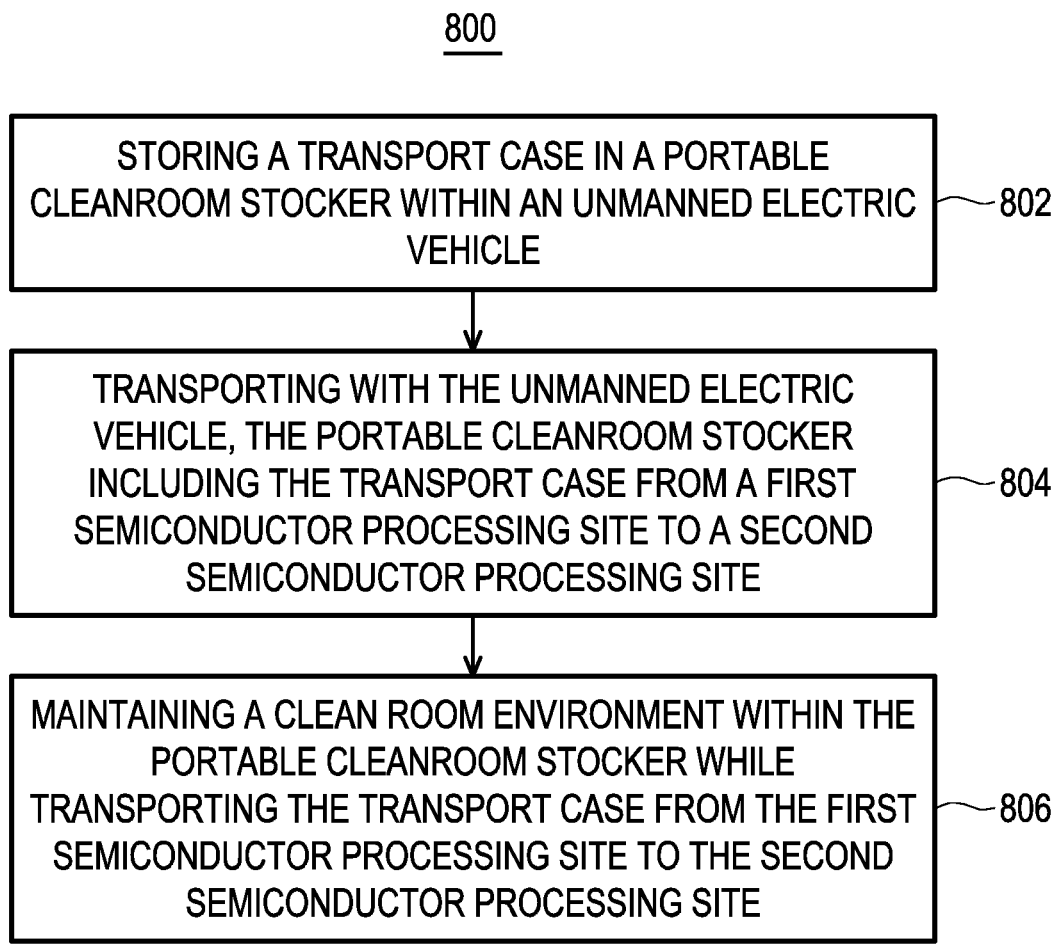
FIG. 8 is a flow diagram of a method for operating a semiconductor processing system, in accordance with some embodiments.

FIG. 8 is a flow diagram of a method 800 for operating a semiconductor processing system, in accordance with some embodiments. The method 800 can utilize systems, components, and processes described in relation to FIGS. 1-7. At 802, the method 800 includes storing a transport case in a portable cleanroom stocker within an unmanned electric vehicle. One example of a transport case is the transport case 110 of FIG. 1. One example of a portable clean room stocker is the portable clean room stocker 108 of FIG. 1. One example of an unmanned electric vehicle is the unmanned electric vehicle 106 of FIG. 1. At 804, the method 800 includes transporting, with the unmanned electric vehicle, the portable cleanroom stocker including the transport case from a first semiconductor processing site to a second semiconductor processing site. One example of a first semiconductor processing site is the first semiconductor processing site 102 of FIG. 1. One example of a second semiconductor processing site is the second semiconductor processing site 104 of FIG. 1. At 806, the method 800 includes maintaining a cleanroom environment within the portable cleanroom stocker while transporting the transport case from the first semiconductor processing site to the second semiconductor processing site.

Figure 9:
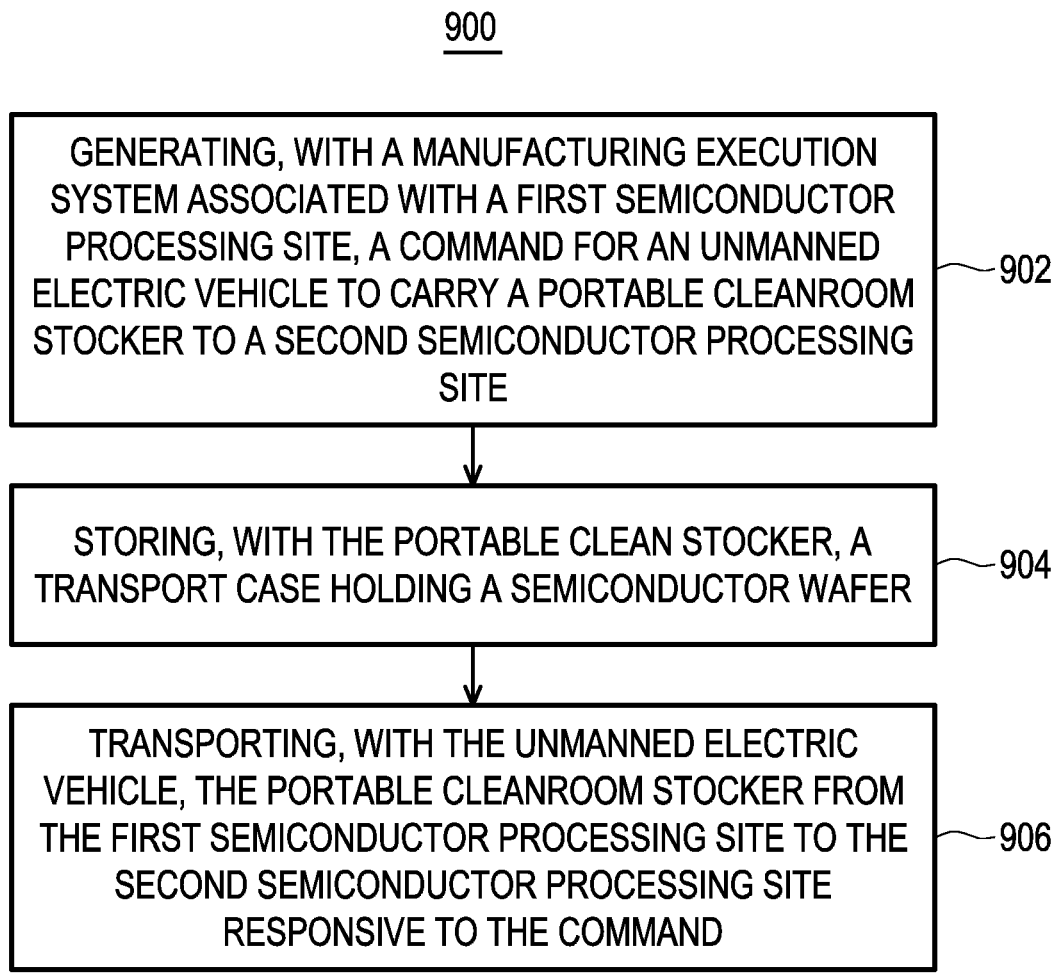
FIG. 9 is a flow diagram of a method for operating a semiconductor processing system, in accordance with some embodiments.

FIG. 9 is a flow diagram of a method 900 for operating a semiconductor processing system, in accordance with some embodiments. The method 900 can utilize systems, components, processes described in relation to FIGS. 1-8. At 902, the method 900 includes generating, with a manufacturing execution system associated with a first semiconductor processing site, a command for an unmanned electric vehicle to carry a portable cleanroom stocker to a second semiconductor processing site. One example of a manufacturing execution system is the MES 156 of FIG. 4. One example of a first semiconductor processing site is the first semiconductor processing site 102 of FIG. 4. One example of an unmanned electric vehicle is the unmanned electric vehicle 108 of FIG. 4. One example of a portable clean room stocker is the portable clean room stocker 108 of FIG. 4. One example of a second semiconductor processing site is the second semiconductor processing site 104 of FIG. 4. At 904, the method 900 includes storing, with the portable clean stocker, a transport case holding a semiconductor wafer. One example of a transport case is transport case 110 of FIG. 1. One example of a semiconductor wafer is the semiconductor wafer 208 of FIG. 7. At 906, the method 900 includes transporting, with the unmanned electric vehicle, the portable cleanroom stocker from the first semiconductor processing site to the second semiconductor processing site responsive to the command.

Embodiments of the present disclosure help ensure that semiconductor wafers or other sensitive semiconductor processing equipment or materials are not contaminated during transport between semiconductor processing sites. Embodiments of the present disclosure provide an unmanned electric vehicle that can carry a portable cleanroom stocker. The portable cleanroom stocker includes a plurality of storage ports for securely holding transport cases utilized to store or transport sensitive semiconductor equipment such as wafers or reticles. The portable cleanroom stocker provides full cleanroom level environments within the interior of the portable cleanroom stocker during transport of the transport cases. The portable cleanroom stocker can also include unmanned travel to load and unload itself from the unmanned electric vehicle.

The combination of the unmanned electric vehicle and the portable cleanroom stocker provide several benefits. Transport of sensitive wafers or other equipment between semiconductor processing sites can be accomplished in an entirely automated manner while providing full cleanroom level environmental protection of the sensitive equipment within the portable cleanroom stocker. This ensures that semiconductor wafers and other sensitive equipment are not contaminated during transport between semiconductor processing sites. The result is better functioning integrated circuits and improved wafer yields.

In one embodiment, a method includes storing a transport case in a portable cleanroom stocker within an unmanned electric vehicle and transporting, with the unmanned electric vehicle, the portable cleanroom stocker including the transport case from a first semiconductor processing site to a second semiconductor processing site. The method includes maintaining a cleanroom environment within the portable cleanroom stocker while transporting the transport case from the first semiconductor processing site to the second semiconductor processing site.

In one embodiment, a method includes generating, with a manufacturing execution system associated with a first semiconductor processing site, a command for an unmanned electric vehicle to carry a portable cleanroom stocker to a second semiconductor processing site. The method includes storing, with the portable clean stocker, a transport case holding a semiconductor wafer and transporting, with the unmanned electric vehicle, the portable cleanroom stocker from the first semiconductor processing site to the second semiconductor processing site responsive to the command.

In one embodiment, a system includes a portable cleanroom stocker including a plurality of ports each configured to hold a respective transport case for sensitive semiconductor equipment and an interior environment management system configured to maintain cleanroom conditions within the clean-room stocker during transport of the portable cleanroom stocker. The system includes an unmanned electric vehicle including a cargo bay configured to hold the portable cleanroom stocker and a control module configured to execute one or more programs to control the unmanned electric vehicle to transport the portable cleanroom stocker from a first semiconductor processing site to a second semiconductor processing site.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    storing a transport case in a portable cleanroom stocker;
    driving, with a vehicle guidance module of the portable cleanroom stocker, the portable cleanroom stocker into an unmanned electric vehicle;
    transporting, with the unmanned electric vehicle, the portable cleanroom stocker including the transport case from a first semiconductor processing site to a second semiconductor processing site; and
    maintaining a cleanroom environment within the portable cleanroom stocker while transporting the transport case from the first semiconductor processing site to the second semiconductor processing site.

2. The method of claim 1, wherein transporting the portable cleanroom stocker includes executing one or more manufacturing execution system applications with a control module of the unmanned electric vehicle.

3. The method of claim 2, comprising:
    receiving, with the control module of the unmanned electric vehicle, a command from a manufacturing execution system associated with the first semiconductor processing site; and
    controlling, with the control module, the transporting of the portable cleanroom stocker from the first semiconductor processing site to the second semiconductor processing site responsive to receiving the command from the manufacturing execution system associated with the first semiconductor processing site.

4. The method of claim 3, wherein the command includes identification data identifying the second semiconductor processing site as a destination.

5. The method of claim 4, comprising generating the command by executing an application with a virtual machine associated with the manufacturing execution system associated with the first semiconductor processing site.

6. The method of claim 1, comprising recording, with a transportation data management module of the unmanned electric vehicle, transportation data including details associated with transporting the portable cleanroom stocker including the transport case from a first semiconductor processing site to a second semiconductor processing site.

7. The method of claim 6, wherein the details include an identification of the second semiconductor processing site.

8. The method of claim 6, comprising providing the details to a manufacturing execution system associated with the second semiconductor processing site.

9. The method of claim 1, wherein maintaining a cleanroom environment includes cycling purging fluids through an interior of an environment management module of the cleanroom stocker.

10. The method of claim 9, wherein the purging fluids include one or more of N2, O2, or dry-air.

11. A system, comprising:
a portable cleanroom stocker including:
a plurality of ports each configured to hold a respective transport case for sensitive semiconductor equipment; and
an interior environment management system configured to maintain cleanroom conditions within the clean-room stocker during transport of the portable cleanroom stocker;
wheels;
a vehicle guidance module configured to drive the portable cleanroom stocker; and
an unmanned electric vehicle including:
a cargo bay configured to hold the portable cleanroom stocker; and
a control module configured to execute one or more programs to control the unmanned electric vehicle to transport the portable cleanroom stocker from a first semiconductor processing site to a second semiconductor processing site, the vehicle guidance module of the portable cleanroom stocker configured to maneuver the portable cleanroom stocker into the unmanned electric vehicle.

12. The system of claim 11, wherein the portable cleanroom stocker includes one or more purging fluid sources, wherein the interior environment management system is configured to cycle purging fluids through the ports to maintain cleanroom conditions within the portable cleanroom stocker.

13. The system of claim 11, wherein the portable cleanroom stocker includes a manufacturing execution system interface.

14. The system of claim 11, wherein the unmanned vehicle includes a power source configured to power the unmanned vehicle and to power the portable cleanroom stocker during transportation.

15. The system of claim 11, wherein the control module is configured to receive a command from a manufacturing execution system associated with the first semiconductor processing site and to control the transporting of the portable cleanroom stocker from the first semiconductor processing site to the second semiconductor processing site responsive to receiving the command from the manufacturing execution system associated with the first semiconductor processing site.

16. The system of claim 11, wherein the ports are configured to hold one or more of front opening unified pods, wafer cassettes, and wafer frame cassettes.

17. A method, comprising:
generating, with a manufacturing execution system associated with a first semiconductor processing site, a command for an unmanned electric vehicle to carry a portable cleanroom stocker to a second semiconductor processing site;
storing, with the portable cleanroom stocker, a transport case holding a semiconductor wafer;
driving, with a vehicle guidance module of the portable cleanroom stocker, the portable cleanroom stocker into the unmanned electric vehicle; and
transporting, with the unmanned electric vehicle, the portable cleanroom stocker from the first semiconductor processing site to the second semiconductor processing site responsive to the command.

18. The method of claim 17, comprising providing, from the unmanned electric vehicle, transportation data to a manufacturing execution system associated with the second semiconductor processing site.

19. The method of claim 17, wherein the portable cleanroom stocker includes:
a power source;
a damper;
an auto-position module; and
a manufacturing execution system interface.

20. The method of claim 17, wherein the portable cleanroom stocker includes shock absorbers.

* * * * *